(12) United States Patent
Ide et al.

(10) Patent No.: US 8,836,199 B2
(45) Date of Patent: Sep. 16, 2014

(54) POWER GENERATION UNIT, SECONDARY CELL, AND ELECTRONIC APPARATUS

(75) Inventors: Noritaka Ide, Shiojiri (JP); Kunio Tabata, Shiojiri (JP); Atsushi Oshima, Shiojiri (JP); Hiroyuki Yoshino, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 62 days.

(21) Appl. No.: 13/619,796

(22) Filed: Sep. 14, 2012

(65) Prior Publication Data

US 2013/0082570 A1 Apr. 4, 2013

(30) Foreign Application Priority Data

Oct. 3, 2011 (JP) .................................. 2011-218987

(51) Int. Cl.
 *H02N 2/18* (2006.01)
 *H01L 41/113* (2006.01)
(52) U.S. Cl.
 CPC ............ *H01L 41/1136* (2013.01); *H02N 2/188* (2013.01); *H02N 2/181* (2013.01)
 USPC ............................. 310/319; 310/317; 310/339
(58) Field of Classification Search
 USPC .......................................... 310/317, 319, 339
 See application file for complete search history.

(56) References Cited

U.S. PATENT DOCUMENTS

| | | |
|---|---|---|
| 5,552,656 A | 9/1996 | Taylor |
| 5,801,475 A | 9/1998 | Kimura |
| 6,252,336 B1 | 6/2001 | Hall |
| 6,522,048 B1 | 2/2003 | Burns et al. |
| 8,026,650 B2 | 9/2011 | Ramadass et al. |
| 8,368,290 B2 | 2/2013 | Kwon et al. |
| 8,373,332 B2 | 2/2013 | Lee |
| 2010/0102782 A1 | 4/2010 | Thiesen et al. |
| 2012/0068576 A1* | 3/2012 | Lee ................................ 310/339 |
| 2012/0119618 A1 | 5/2012 | Tabata et al. |
| 2012/0126666 A1 | 5/2012 | Tabata et al. |

FOREIGN PATENT DOCUMENTS

| | | |
|---|---|---|
| JP | 07-107752 A | 4/1995 |
| JP | 2005-312269 A | 11/2005 |
| JP | 4835888 B1 | 12/2011 |
| JP | 4835889 B1 | 12/2011 |

OTHER PUBLICATIONS

E Lefeuvre et al., "A comparison between several vibration-powered piezoelectric generators for standalone systems", Sensors and Actuators A: Physical, vol. 126, Issue 2, Feb. 14, 2006, pp. 405-416.

* cited by examiner

*Primary Examiner* — Derek Rosenau
(74) *Attorney, Agent, or Firm* — Maschoff Brennan

(57) ABSTRACT

A power generation unit includes a deforming member adapted to repeatedly deform a piezoelectric element, a pair of electrodes provided to the piezoelectric element, an inductor disposed between the pair of electrodes, and constituting a resonant circuit together with a capacitive component of the piezoelectric element, a first switch connected in series to the inductor, a member adapted to detect a timing at which a deformation direction of the deforming member is switched, a full bridge rectifier adapted to rectify a current output from the pair of electrodes, a capacitor connected to the full bridge rectifier, and adapted to store a current supplied from the full bridge rectifier, a second switch connected between either one of the pair of electrodes and the capacitor, and a control circuit adapted to operate the first switch and the second switch.

3 Claims, 11 Drawing Sheets

POWER GENERATION UNIT, SECONDARY CELL, AND ELECTRONIC APPARATUS

BACKGROUND

1. Technical Field

The present invention relates to a power-generating device, a secondary cell, and an electronic apparatus.

2. Related Art

When a piezoelectric material such as lead zirconium titanate (PZT), quartz crystal ($SiO_2$), or zinc oxide (ZnO) is deformed in response to an external force, electrical polarization is induced inside the material, and positive and negative charges appear on the surface. Such a phenomenon is called a piezoelectric effect. There has been proposed an electrical power generation method of vibrating a cantilever to thereby make a weight repeatedly act on the piezoelectric material, and thus taking out the charge generated on the surface of the piezoelectric material as a current using such a characteristic the piezoelectric material has.

For example, by vibrating a metal cantilever having a mass disposed at the tip and a thin plate made of the piezoelectric material bonded thereto, and taking out the positive and negative charges generated on the piezoelectric material due to the vibration, an alternating current is generated. Then the alternating current is rectified by diodes, and then stored in a capacitor, and then taken out as electricity. Such a technology has been proposed in, for example, JP-A-7-107752. Further, there has been also proposed a technology of arranging that a junction is closed only in the period during which the positive charges are generated in a piezoelectric element to thereby make it possible to obtain a direct current without causing a voltage loss in the diodes (see, e.g., JP-A-2005-312269). By using these technologies, downsizing of the power generation unit can be achieved. Therefore, an application such as incorporation of the power generation unit to a small-sized electronic component instead of a battery is expected.

However, in the proposed power generation unit according to the related art, there arises a problem that the obtainable voltage is limited up to the voltage generated by the electrical polarization of the piezoelectric material. Therefore, in most cases, an additional step-up circuit is required, and there arises a problem that it is difficult to sufficiently downsize the power generation unit. Further, an electrical power is usually required to drive the step-up circuit, and there arises a problem that the step-up operation becomes difficult if the electrical energy in the capacitor is reduced. Although it is also possible to dispose a full bridge rectifier or a voltage doubler rectifier in parallel to the step-up circuit in order for solving this problem, there arises a problem that the power generation unit grows in size.

SUMMARY

An advantage of some aspects of the invention is to solve at least a part of the problems described above, and the invention can be implemented as the following forms or application examples.

Application Example 1

This application example is directed to a power generation unit including: a piezoelectric element including a piezoelectric material, a deforming member adapted to repeatedly deform the piezoelectric element, a pair of electrodes provided to the piezoelectric element, an inductor electrically connected to the piezoelectric element, a first switch disposed between the piezoelectric element and the inductor, a member adapted to detect a timing at which a deformation direction of the deforming member is switched, a full bridge rectifier adapted to rectify a current output from the pair of electrodes, a capacitor electrically connected to the full bridge rectifier, and adapted to store a current supplied from the full bridge rectifier, a second switch disposed between either one of the pair of electrodes and the capacitor, and a control circuit adapted to operate the first switch and the second switch.

According to this application example, by repeatedly deforming the piezoelectric element while switching the deformation direction in accordance with the external force, the positive and negative charges are generated in the piezoelectric element due to the piezoelectric effect. Since the piezoelectric element can be assumed to be a capacitor from the viewpoint of the electrical circuit, when shorting the first switch to thereby connect the piezoelectric element to the inductor, a resonant circuit is formed of the piezoelectric element and the inductor connected to each other. Then, the charge generated in the piezoelectric element flows into the inductor. Then, since the piezoelectric element and the inductor constitutes the resonant circuit, the current having flown into the inductor overshoots, and then flows into the piezoelectric element through the terminal on the opposite side. Thus, it is possible to reverse the arrangement of the positive and negative charges having been generated in the piezoelectric element before connecting the inductor thereto.

Then, when deforming the piezoelectric element in the opposite direction in turn in this state, it results that the charge generated due to the piezoelectric effect is accumulated in addition to the charge reversed and then accumulated. As a result, it becomes possible to accumulate the charge generated by repeatedly deforming the piezoelectric element in the piezoelectric element. Further, since the voltage between the terminals increases in accordance with the charge accumulated in the piezoelectric element, it is possible to generate a voltage higher than the voltage generated by the electrical polarization of the piezoelectric material without additionally preparing a step-up circuit. As a result, a small-sized and efficient power generation unit can be obtained.

Here, in order to perform the step-up operation described above, it becomes necessary to actively control the first switch for connecting/disconnecting the piezoelectric element and the inductor. Specifically, once the voltage applied to the control circuit drops to a level lower than the lower limit voltage necessary to drive the first switch, it becomes unachievable to actively control the first switch, and thus, it results that the current is rectified by the full bridge rectifier and is then stored without performing the step-up operation described above.

Since the voltage, which can be stored in the capacitor, is low in the case of rectifying the current with the full bridge rectifier and then performing the storage, it is difficult to supply the control circuit with the voltage equal to or higher than the lower limit voltage necessary to drive the first switch. Therefore, in such a case, the control circuit sets the second switch to a connected state to thereby switch the circuit to the voltage doubler rectifier using the capacitive component of the piezoelectric element. Thus, since it is possible to store the voltage approximately twice as high as the voltage by the full bridge rectifier, the voltage applied to the control circuit exceeds the lower limit voltage necessary to drive the first switch. Therefore, the self-recovery to the step-up operation described above can be achieved. Further, since the voltage doubler rectification is performed using the capacitive component of the piezoelectric element, no additional components are required, and a small-sized and low-cost power generation unit can be provided.

Application Example 2

This application example is directed to the power generation unit according to the application example described above, wherein when a voltage stored in the capacitor reaches a voltage with which the control circuit can drive the second switch, the control circuit sets the first switch to an open state, and the second switch to a shorted state.

According to this application example, by setting the first switch to the open state and the second switch to the shorted state when the voltage stored in the capacitor has reached the voltage with which the control circuit can drive the second switch, it becomes possible to store the voltage approximately twice as high as the voltage by the full bridge rectifier in the capacitor. Therefore, the voltage applied to the control circuit exceeds the lower limit voltage necessary to drive the first switch, and the self-recovery to the step-up operation described above can be achieved. Further, since the voltage doubler rectification is performed using the capacitive component of the piezoelectric element, no additional components are required, and a small-sized and low-cost power generation unit can be provided.

Application Example 3

This application example is directed to the power generation unit according to the application example described above, wherein when a voltage charged in the capacitor reaches a voltage with which the control circuit can drive the first switch and the second switch, the control circuit sets the second switch to an open state, and performs a control of setting the first switch to a shorted state at the timing at which the deformation direction of the deforming member is switched, and then setting the first switch to the open state after a time corresponding to a half cycle of a resonance period of a resonant circuit composed mainly of the inductor and the capacitor has elapsed.

According to this application example, when performing the step-up operation by operating the first switch, by setting the second switch to the open state to thereby make the circuit function as the full bridge rectifier, it is possible to efficiently perform the step-up operation. Further, since the larger the amount of deformation of the piezoelectric element is, the larger the amount of the charge generated is, by setting the first switch to the shorted state when the deformation direction is switched, it is possible to reverse the positive and negative charges in the piezoelectric element when the amount of the charge stored in the piezoelectric element is the maximum. The time during which the first switch is shorted corresponds to the time necessary for the charges in the piezoelectric element to be reversed, and by shorting the first switch for the period of time corresponding to a half of the resonance period of the resonant circuit formed of the piezoelectric element and the inductor, the step-up operation can be performed with the highest efficiency.

Application Example 4

This application example is directed to the power generation unit according to the application example described above, which further includes a charging state detection section adapted to detect a charging state of the capacitor, when the charging state detection section detects a state in which charging of the capacitor stops, the control circuit performs a control of setting the second switch to a shorted state, and setting the first switch to an open state.

According to this application example, when performing the step-up operation, if the charging state detection section fails to detect the charging, the step-up operation is stopped, and the second switch is set to the shorted state. The state in which the charging state detection section fails to detect the charging corresponds to the state in which no current is flowing from the piezoelectric element to the capacitor, and if the step-up operation is performed in this state, the step-up operation has no contribution to the electrical power generation. In other words, the electrical power necessary to perform the step-up operation is wasted. Therefore, by stopping the step-up operation if the charging state detection section fails to detect the current, it can be prevented to waste the electrical power. Further, if the step-up operation is stopped, since only the full bridge rectifier can operate, the generation voltage of the piezoelectric element is dropped to a level lower than in the case of performing the step-up operation, and it becomes difficult to make the current flow from the piezoelectric element to the capacitor. However, by shorting the second switch to thereby switch the circuit to the voltage doubler rectifier, since the output voltage of the piezoelectric element increases to a level higher than in the full bridge rectifier, it becomes easy to supply the capacitor with the current. According to the above configuration, a power generation unit with a high efficiency can be provided.

Application Example 5

This application example is directed to a secondary cell including the power generation unit according to any one of the application examples described above.

According to this application example, the voltage doubler rectification is performed even in the state in which the output voltage of the secondary cell is dropped and the control of the first switch is unachievable. Further, by promptly making a transition to the step-up operation with a high electrical power generation efficiency after obtaining the voltage equal to or higher than the lower limit voltage, it becomes possible to provide a secondary cell having an electrical power generation efficiency higher than that of the ordinary full-wave rectification, and capable of achieving the self-recovery.

Application Example 6

This application example is directed to an electronic apparatus including the power generation unit according to any one of the application examples described above.

According to this application example, since the power generation unit having an electrical power generation efficiency higher than that of the ordinary full-wave rectification, and capable of achieving the self-recovery is provided, it becomes possible to provide an electronic apparatus with a high efficiency.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Embodiment

Electrical Power-Generating Device Having Configuration of the Invention

Figure 1:
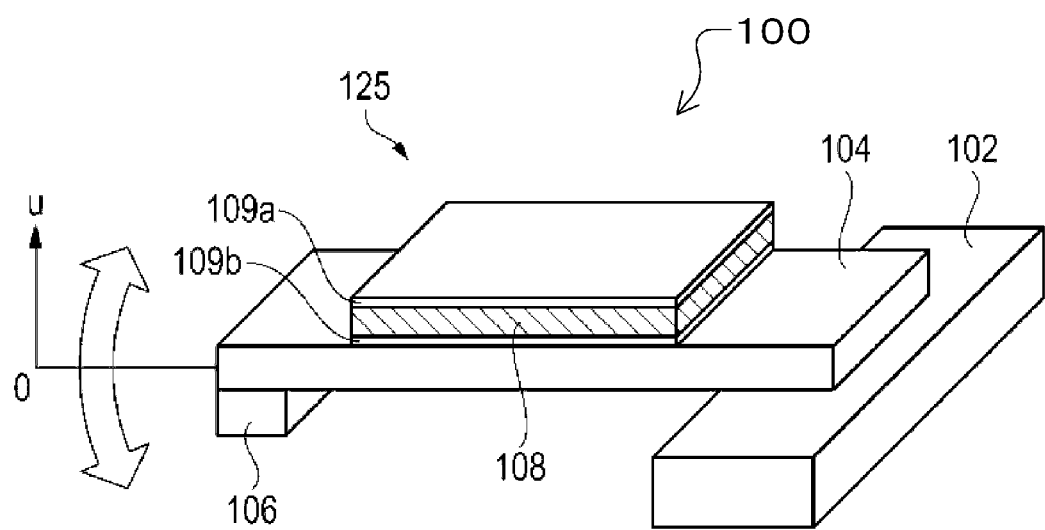
FIG. 1 is a schematic diagram showing a structure of a power generation unit according to an embodiment of the invention.

Hereinafter, an embodiment of the invention will be described with reference to the accompanying drawings. FIG. 1 is a schematic diagram showing a structure of a power generation unit according to the present embodiment. The mechanical structure of an electrical power-generating section 125 provided to a power generation unit 100 described in the present embodiment is a cantilever structure having a beam 104, which is a deforming member, and has a mass 106 disposed on the tip thereof, fixed to a base 102 on a base end side thereof. Further, a piezoelectric element 108 formed of a piezoelectric material such as lead zirconium titanate (PZT) is fixedly supported by a surface of the beam 104 as a support body, and a first electrode 109a and a second electrode 109b as a pair of electrodes using a conductive body such as a metal thin film are disposed respectively on the both surfaces of the piezoelectric element 108. It should be noted that although in the example shown in FIG. 1, the piezoelectric element 108 is disposed on the upper surface side of the beam 104, it is also possible to dispose the piezoelectric element 108 on the lower side of the beam 104, or it is also possible to dispose the piezoelectric elements 108 on both of the upper surface side and the lower surface side of the beam 104. It should be noted that it is assumed that the term "upper" denotes the direction (the positive direction of "u" in the drawing) in which the first electrode 109a is viewed from the piezoelectric element 108, and the term "lower" denotes the opposite direction to the "upper" direction.

Since the beam 104 is fixed to the base 102 at the base end side thereof, and has the mass 106 disposed on the tip side thereof, when vibration or the like is applied to the beam 104, the tip of the beam 104 vibrates with a large amplitude as indicated by an outlined arrow in the drawing. As a result, the piezoelectric element 108 attached to the surface of the beam 104 is provided with a cyclic deformation due to the external force, and it results that compressive force and tensile force act alternately thereon. Then, the piezoelectric element 108 generates positive and negative charges due to the piezoelectric effect, and the charges appear on the first electrode 109a and the second electrode 109b, and are taken out as a current.

Figure 2A:
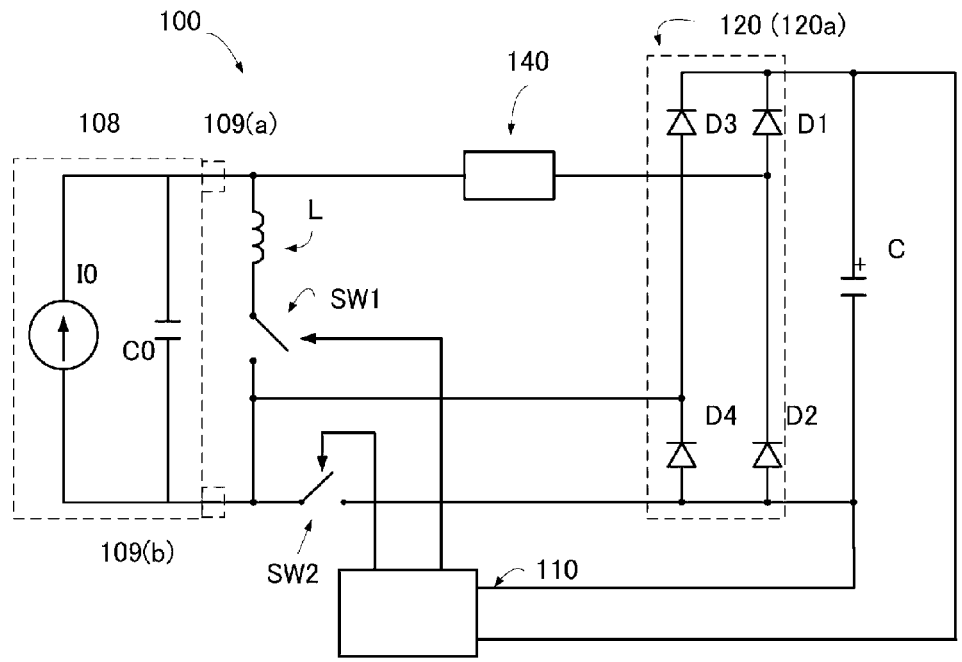
FIGS. 2A and 2B are circuit diagrams of the power generation unit according to the embodiment.
Figure 2B:
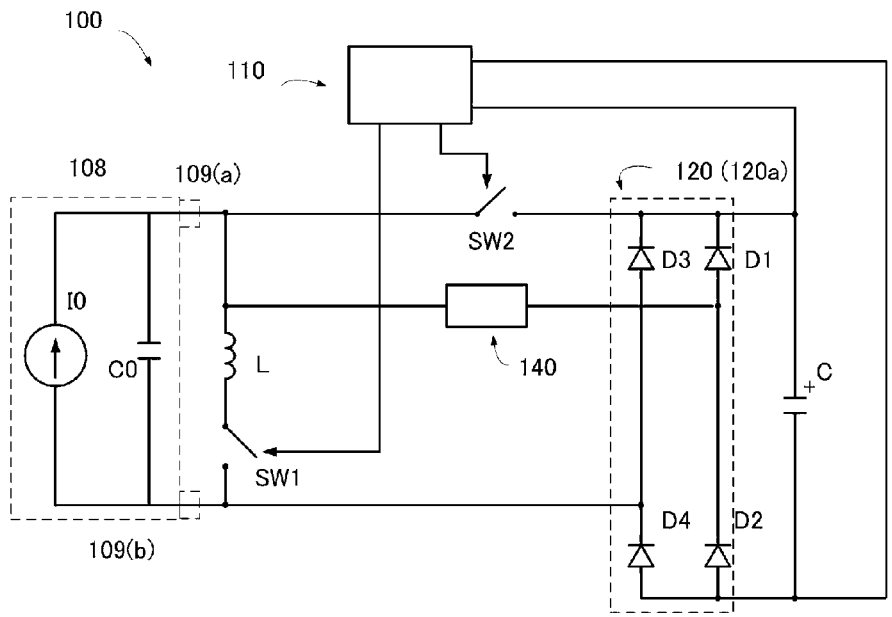

FIGS. 2A and 2B are circuit diagrams of the power generation unit 100 according to the present embodiment. The piezoelectric element 108 can electrically be expressed as a current source I0 and a capacitor C0 for storing a charge. An inductor L is connected in parallel to the piezoelectric element 108 to thereby form an electrical resonant circuit together with the capacitance component C0 of the piezoelectric element 108. Further, a first switch SW1 for shorting/opening the resonant circuit is connected in series to the inductor L. Although a second switch SW2 is connected to the second electrode 109b and a capacitor in FIG. 2A, it is also possible to connect the second switch SW2 to the first electrode 109a as shown in FIG. 2B. The shorting/opening of the first switch SW1 and the shorting/opening of the second switch SW2 are controlled by a control circuit 110. Further, the first electrode 109a and the second electrode 109b provided to the piezoelectric element 108 are connected to a full bridge rectifier 120 composed of four diodes D1 through D4. Although the details will be described later, a member 140 for detecting the timing at which the deformation direction is switched is provided for determining the timing of shorting the resonant circuit. Although in the present embodiment the timing at which the deformation direction is switched is determined based on the value of the current flowing from the piezoelectric element to the full bridge rectifier, it is also possible to determine the timing using an output voltage of a displacement sensor or the piezoelectric element besides the above. Here, junction diodes are used as the diodes D1 through D4. The diodes D1 through D4 function as the full bridge rectifier 120 when the second switch SW2 is set to the open state. Further, the diodes D1 through D4 function as a rectifier device for converting the alternating current into the direct current together with the capacitor C.

Further, the diodes D1 through D4 function as a voltage doubler rectifier 120a in the case of setting the second switch SW2 to the short state. The positive and negative charges generated by the piezoelectric element 108 are taken out by the first electrode 109a and the second electrode 109b, and form an alternating current. Then, the alternating current is converted into a pulsating current by the full bridge rectifier 120 or the voltage doubler rectifier 120a provided with the diodes D1 through D4. Then, the pulsating current is stored in the capacitor C.

Operation in Steady State

FIGS. 3A through 3D are graphs showing an operation of the power generation unit 100 according to the present embodiment in a steady state. Here, it is assumed that the steady state denotes the case in which the voltage capable of controlling the operation of the first switch SW1 and the second switch SW2 is supplied to the control circuit 110.

Figure 3A:
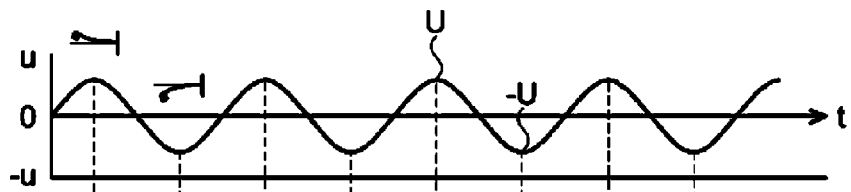
FIGS. 3A through 3D are graphs showing an operation of the power generation unit according to the embodiment in a steady state.
Figure 3B:
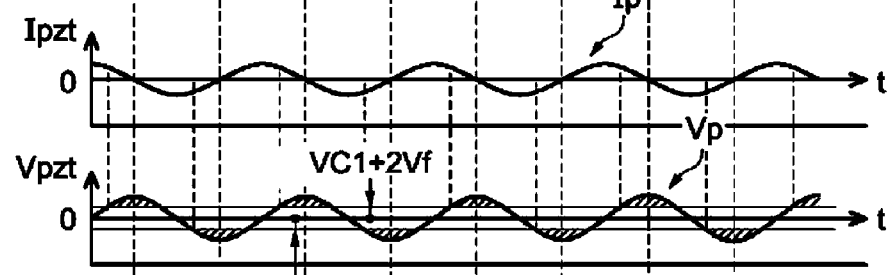

FIG. 3A shows a movement of the position of the displacement of the tip of the beam 104. The vertical axis represents the displacement u, and the horizontal axis represents the time t. The unit of the displacement is an arbitrary unit. As shown in FIG. 3A, it is expressed that the displacement u of the tip of the beam 104 varies with the vibration of the beam 104. It should be noted that the positive displacement u represents the state (the state in which the upper surface of the beam 104 has a concave shape) in which the beam 104 warped upward, and the negative displacement (−u) represents the state (the state in which the lower surface of the beam 104 has a concave shape) in which the beam 104 warped downward. Further, FIG. 3B shows the state of the current generated by the piezoelectric element 108 due to the deformation of the beam 104 and the electro motive force caused inside the piezoelectric element 108 as a result thereof. it should be noted that in FIG. 3B, the state of the charge generated in the piezoelectric element 108 is expressed as an amount of charge (i.e., a current Ip) generated per unit time. Here, the vertical axis represents the current Ipzt flowing through the piezoelectric element 108. Further, the electro motive force generated in the piezoelectric element 108 is shown with the vertical axis representing the electrical potential difference Vpzt generated between the first electrode 109a and the second electrode 109b. In the case of performing the operation in the steady state, the second switch SW2 is opened.

As shown in FIGS. 3A and 3B, during the period in which the displacement of the beam 104 is increasing, the piezoelectric element 108 generates the current of the positive direction (i.e., the current Ip takes a positive value). In accordance therewith, the electrical potential difference Vp between the first electrode 109a and the second electrode 109b increases in the positive direction. If the electrical potential difference Vp in the positive direction exceeds the sum of the voltage VC1 between the terminals of the capacitor C and a twofold of the forward voltage drop Vf of the diode constituting the full bridge rectifier 120, namely VC1+2 Vf, the charge generated thereafter can be taken out as a direct current and stored in the capacitor C. Further, during the period in which the displacement of the beam 104 is decreasing, the piezoelectric element 108 generates a current of the negative direction (i.e., the current Ip takes a negative value). In accordance therewith, the electrical potential difference Vp between the first electrode 109a and the second electrode 109b increases in the negative direction. If the electrical potential difference Vp in the negative direction exceeds the sum of VC1 and 2 Vf of the full bridge rectifier 120, the charge generated can be taken out as a direct current and stored in the capacitor C. A typical electrical power-generating method is as described hereinabove. Here, a method of performing a more efficient electrical power generation by controlling the first switch SW1 will be explained.

Figure 3C:
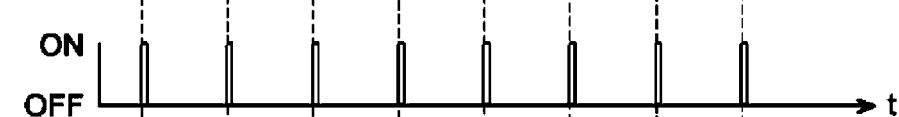
Figure 3D:
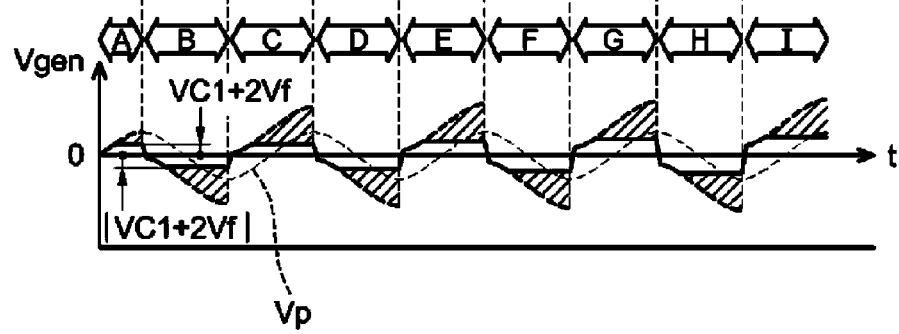

FIG. 3C is a graph showing the timing of shorting (ON) the first switch SW1, wherein the first switch SW1 is in the ON state only in the period indicated as "ON." FIG. 3D shows a voltage waveform obtained in the case in which the first switch SW1 is shorted (ON) at the timing shown in FIG. 3C. The vertical axis represents the electrical potential difference Vgen generated between the first electrode 109a and the second electrode 109b as the generated voltage.

The first switch SW1 is shorted (ON) at the timing (the timing at which the displacement of the piezoelectric element 108 takes a local maximum or a local minimum) shown in FIG. 3C. Then, as shown in FIG. 3D, there occurs a phenomenon that the voltage waveform between the first electrode 109a and the second electrode 109b sandwiching the piezoelectric element 108 varies as if it is shifted at the moment that the first switch SW1 is shorted. For example, in the period B indicated as "B" in FIG. 3D, such a voltage waveform indicated by the thick dotted line as is obtained by shifting the electrical potential difference Vp indicated by the thin dotted line corresponding to the electro motive force of the piezoelectric element 108 toward the negative direction appears between the first electrode 109a and the second electrode 109b sandwiching the piezoelectric element 108.

Further, in the period C indicated as "C" in FIG. 3D, there appears such a voltage waveform indicated by the thick dotted line as is obtained by shifting the electrical potential difference Vp corresponding to the electro motive force of the piezoelectric element 108 toward the positive direction. Similarly, thereafter, in each of the period D, the period E, the period F, and so on, there appears such a voltage waveform indicated by the thick dotted line as is obtained by shifting the electrical potential difference Vp corresponding to the electro motive force of the piezoelectric element 108 toward the positive direction or the negative direction.

These can be obtained using the resonant phenomenon in the resonant circuit provided with the inductor L and the capacitive component C0 of the piezoelectric element 108. When shorting (ON) the first switch SW1 at the timing (when the displacement takes –u in FIG. 3A) when the displacement of the piezoelectric element 108 takes a local minimum, the current flowing through the inductor L start flowing gradually against the inductance of the inductor L. Then, when the voltage between the both ends of the capacitive component C0 vanishes, the current flowing through the inductor L becomes the maximum. Subsequently, the current continues to flow due to the inductance of the inductor L, and then vanishes at the state in which the voltage between the both ends of the capacitive component C0 is reversed. Then, the first switch SW1 is opened (OFF).

After then, it results that the piezoelectric element 108 is warped to the opposite direction. In other words, the current Ip takes a positive value, and charges the capacitive component C0 in the positive direction. Since the charge stored in the capacitive component C0 is held in the inverted state in the operation described above, a value larger than the value, which can be generated by the piezoelectric element 108 in the typical operation, can be taken by newly adding the positive charge.

Then, by performing the same operation when the displacement of the piezoelectric element 108 takes a local maximum (when the displacement takes u in FIG. 3A), the negative electrical potential difference Vp with an absolute value larger than the value, which can be generated in the typical operation, is generated in turn. In other words, by shorting the first switch SW1 at the timing when the displacement of the piezoelectric element 108 takes a local maximum or a local minimum during the period corresponding to a half cycle of the resonance period of the resonant circuit composed of the capacitive component C0 and the inductor L, it becomes possible to more efficiently take out the electrical power from the piezoelectric element 108.

In this case, the charge in the piezoelectric element 108 increases every time the piezoelectric element 108 is deformed, unless the charge is made to flow out of the piezoelectric element 108. Therefore, the voltage between the first electrode 109a and the second electrode 109b sandwiching the piezoelectric element 108 increases.

Here, in the part (the part indicated by hatching in FIG. 3D) where the voltage exceeds the sum of VC1 and 2 Vf, the charge generated by the piezoelectric element 108 is stored in the capacitor C. Therefore, the charge is made to flow from the piezoelectric element 108 to the capacitor C, and the voltage between the first electrode 109a and the second electrode 109b is clipped at the voltage (VC1+2 Vf) corresponding to the sum of the inter-terminal voltage of the capacitor C and 2 Vf. As a result, the waveform indicated by the thick solid line in FIG. 3D is obtained as the voltage waveform of the voltage between the first electrode 109a and the second electrode 109b.

As is obvious from the comparison between the case of keeping the first switch SW1 open shown in FIG. 3B and the case of shorting the first switch SW1 at the timing when the deformation direction of the beam 104 is switched, in the power generation unit 100 according to the present embodiment, it becomes possible to efficiently store the charge in the capacitor C by shorting/opening the first switch SW1 at appropriate timing.

Further, if the charge is stored in the capacitor C and the voltage between the both terminals of the capacitor C increases, the shift amount of the voltage waveform also increases in accordance therewith. For example, in comparison between the period B (the state in which no charge is stored in the capacitor C) in FIG. 3D and the period H (the state in which the charge is stored in the capacitor C) in FIG. 3D, the shift amount of the voltage waveform is larger in the period H. Similarly, in comparison between the period C and the period I in FIG. 3D, the shift amount of the voltage waveform is larger in the period I in which the charge stored in the capacitor C is increased. As a result, in the power generation unit 100 according to the present embodiment, it becomes possible to store the voltage higher than the electrical potential difference Vp generated between the first electrode 109a and the second electrode 109b by deforming the piezoelectric element 108. As a result, it become unnecessary to provide an additional step-up circuit, and thus it becomes possible to obtain a small-sized and highly efficient power generation unit. Hereinafter, this operation is referred to as a step-up operation.

If the timing at which the control circuit 110 turns ON the switch SW and the timing at which the deformation direction of the beam 104 is switched do not strictly coincide with each other, by turning the switch SW for a period corresponding to a half of the resonance period of the resonant circuit, which is composed of the inductor L and the capacitive component C0 of the piezoelectric element 108, at a predetermined period, it is possible to raise the voltage Vgen between the both terminals of the piezoelectric element 108. It should be noted that the device in which the timing at which the switch SW is turned ON and the timing at which the deformation direction of the beam 104 is switched coincide with each other has the highest efficiency, and the device in which the timing at which the switch SW is turned OFF and the timing at which the deformation direction of the beam 104 is switched coincide with each other has the lowest efficiency. In other words, the closer the timing at which the switch SW is turned ON and the timing at which the deformation direction of the beam 104 is switched are, the higher the electrical power generation efficiency is.

Operation with No Starting Voltage Applied

Going back to FIGS. 2A and 2B, although in the case in which the voltage sufficient for the control circuit 110 to operate is supplied in the initial state, it is possible to take out the electrical power provided by the piezoelectric element 108 at a higher efficiency compared to the related art due to the step-up operation described above, if the operating voltage (e.g., 3.3V) is not applied to the control circuit 110 at the time of startup, the first switch SW1 fails to be shorted/opened, and therefore, the step-up operation fails to be performed. Therefore, it becomes necessary to once store the electrical power for starting up the control circuit 110. For example, when considering an application to a wristwatch, in the condition in which the wristwatch is detached from the arm, the piezoelectric element 108 fails to generate electric power. Therefore, when the energy stored in the capacitor C has been worked out, the control circuit 110 becomes difficult to be restarted, and the power generation unit 100 fails to start up the step-up operation. Therefore, it is necessary to once store the electrical power necessary to restart the power generation unit 100.

Here, in the case in which the second switch SW2 and the first switch SW1 are both in the open state, the voltage generated by the piezoelectric element 108 is full-wave rectified by the full bridge rectifier 120, and is then applied to the control circuit 110. The piezoelectric element 108 generates a voltage of about 2.5V although depending on the amplitude of the vibration of the piezoelectric element 108. The voltage is referred to as VC.

When performing the rectification using the full bridge rectifier 120, assuming that the forward voltage drop Vf is 0.4V, the voltage after the rectification takes the value expressed by the following formula. It should be noted that in the case of using the full bridge rectifier 120, since the current flows through the diode two times, the voltage corresponding to twofold of Vf is lost.

$$VC-2\times Vf=2.5[V]-0.4[V]\times 2=1.7[V]$$

Since the voltage fails to reach the voltage (e.g., 3.3V) necessary to start up the control circuit 110, the step-up operation fails to be started up with the voltage.

Figure 4A:
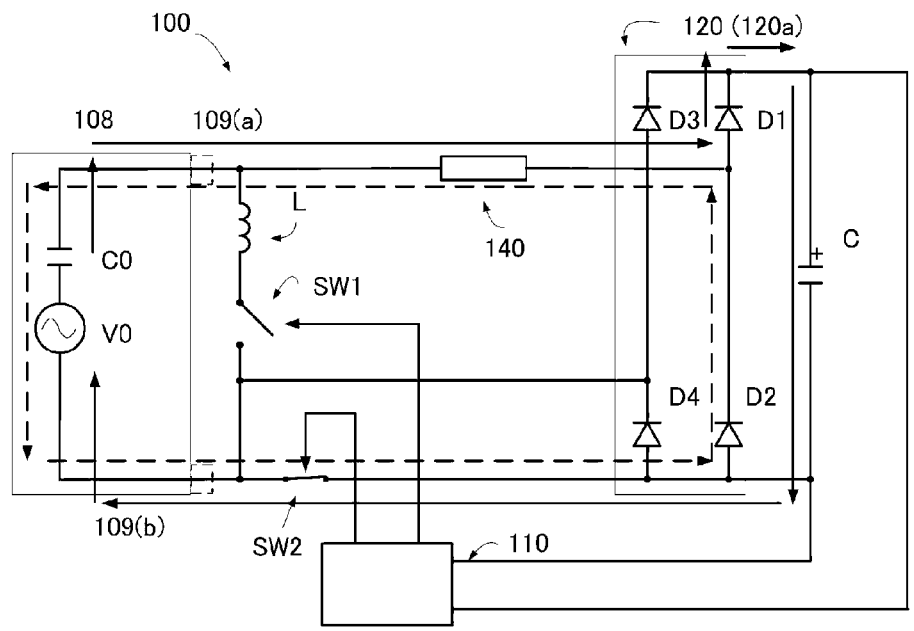
FIG. 4A is a circuit diagram showing a current path when a second switch according to the embodiment is shorted.

Therefore, by shorting the second switch SW2, and making the circuit operate as the voltage doubler rectifier 120a, the starting voltage of the control circuit is accumulated. The operation of accumulating the starting voltage will be explained with reference to FIG. 4A. FIG. 4A is a circuit diagram showing a current path in the case of shorting the second switch SW2 according to the present embodiment. It should be noted that since the description that the piezoelectric element 108 corresponds to the current source I0 and the capacitor C0 for storing the charge is not so common as a drawing method of the voltage doubler rectifier diagram, the explanation will be continued using an equivalent circuit of the piezoelectric element 108 having a voltage source V0 and the capacitor C0 for storing the charge connected in series to each other instead thereof. In the case in which the first electrode 109a outputs a negative voltage and the second electrode 109b outputs a positive voltage, a current flows along the dotted arrow.

The current supplied from the voltage source V0 passes through the second electrode 109b, then passes through the diode D2 and the first electrode 109a, then charges the capacitor C0, and then returns to the voltage source V0. In the case in which the first electrode 109a outputs a positive voltage and the second electrode 109b outputs a negative voltage, a current flows along the solid arrow. In this case, the voltage of the capacitor C0 is added to the voltage of the voltage source V0, and the capacitor C0 and the voltage source V0 function as a single voltage source. The voltage of the capacitor C0 is obtained by subtracting the voltage corresponding to the voltage drop in the diode D2 from the voltage VC of the piezoelectric element 108. The current firstly passes through the capacitor C0, then passes through the first electrode 109a, then passes through the diode D1, and then charges the capacitor C. Then, the current passes through the second electrode 109b, and then returns to the voltage source V0. Here, since the voltage drop Vf of the diode D1 is caused when charging the capacitor C, the inter-terminal voltage of the capacitor C takes the following value.

$$(VC-Cf)+(VC-Vf)=(2.5-0.4)+(2.5-0.4)=4.2[V]$$

Figure 4B:
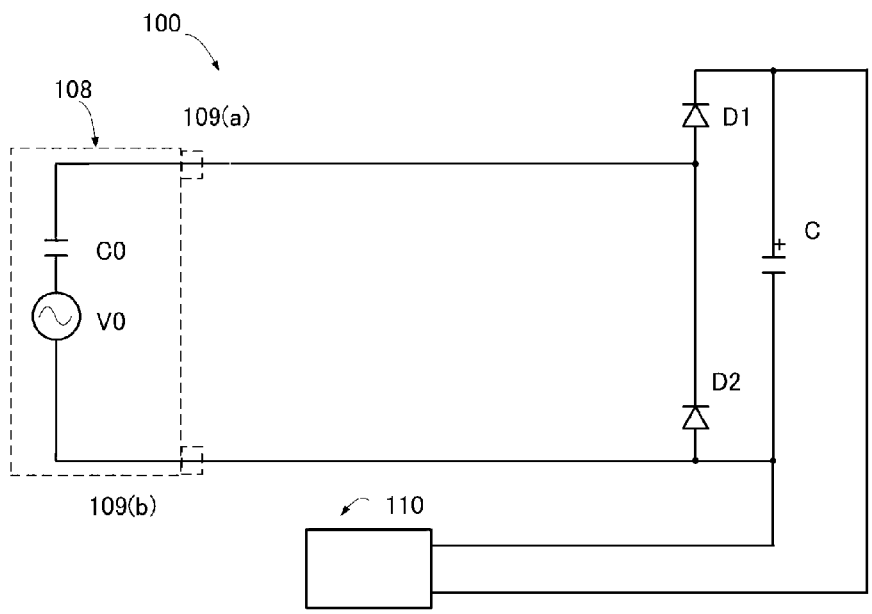
FIG. 4B is an equivalent circuit diagram extracting the part related to the path through which the current shown in FIG. 4A flows.
Figure 5:
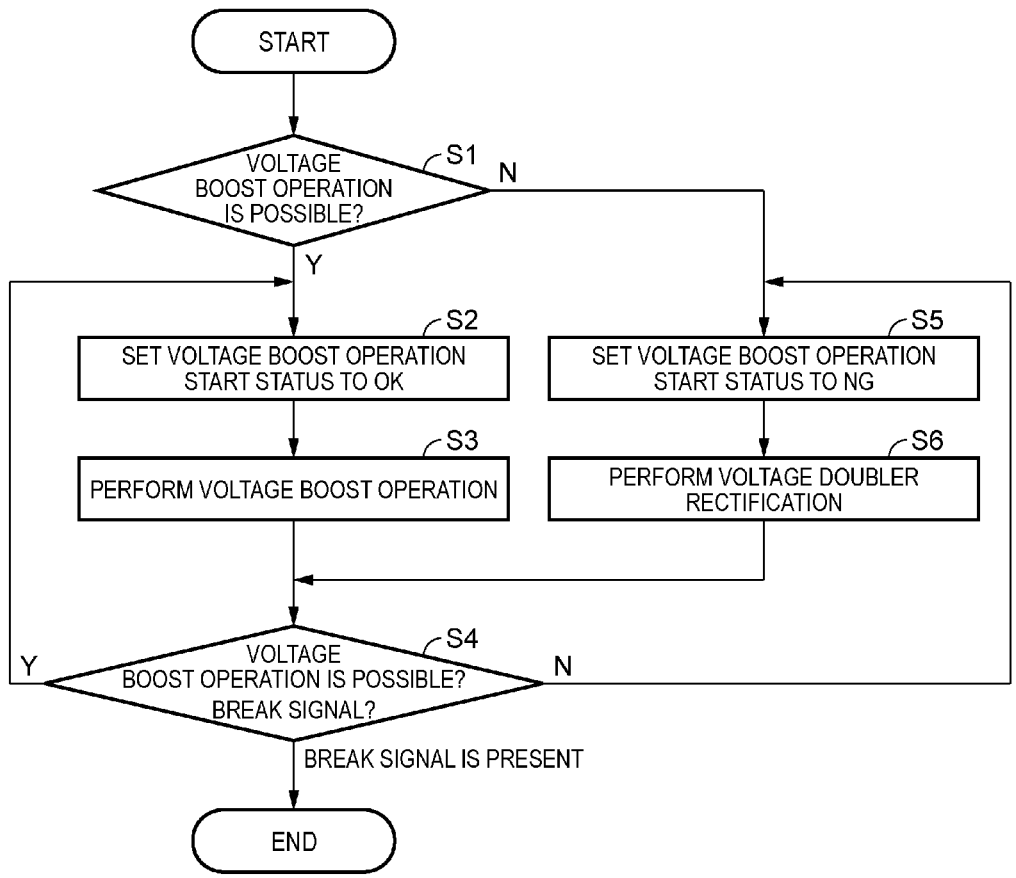
FIG. 5 is a flowchart of the present embodiment for determining which one of the operation in the steady state and the operation for obtaining a starting voltage is selected.

FIG. 4B is an equivalent circuit diagram extracting the part related to the path through which the current shown in FIG. 4A flows. Specifically, FIG. 4B is a circuit diagram extracting the components effectively functioning in the case of opening the first switch SW1 and shorting the second switch SW2. The circuit is a typical voltage doubler rectifier, and it becomes possible to supply a voltage roughly twofold of VC as the voltage between the first electrode 109a and the second electrode 109b sandwiching the piezoelectric element 108 to thereby accumulate the starting voltage of the control circuit.
Operation Sequence Hereinafter, an operation sequence of the power generation unit 100 described above will be explained. FIG. 5 is a flowchart of the present embodiment for determining which one of the operation in the steady state and the operation for obtaining a starting voltage is selected.

Firstly, as the step S1, whether or not the step-up operation can be performed is determined. Specifically, whether or not the voltage higher than the minimum starting voltage of the control circuit 110 is output is determined.

If the voltage lower than the minimum starting voltage is output (N in the step S1), the process proceeds to the step S5.

In the step S5, a step-up operation status is set to NG (the step-up operation is disabled).

Then, as the step S6, the voltage doubler rectification is performed.

Then, as the step S4, whether or not the step-up operation can be performed is determined.

If the voltage equal to or higher than the minimum starting voltage is output (Y in the step S4), the process returns to the step S2.

If the voltage lower than the minimum starting voltage is output (N in the step S4), the process returns to the step S5.

If the voltage lower than the minimum starting voltage is output at the time of START, the sequence described above is taken.

Further, if the voltage lower than the minimum starting voltage is output at the time of START, the sequence described above is taken.

If the voltage equal to or higher than the minimum starting voltage is output (Y in the step S1) in the step S1, the process proceeds to the step S2.

In the step S2, the step-up operation status is set to OK (the step-up operation is enabled).

Then, as the step S3, the step-up operation is performed.

Then, as the step S4, whether or not the step-up operation can be performed is determined.

If the voltage equal to or higher than the minimum starting voltage is output (Y in the step S4), the process returns to the step S2.

If the voltage lower than the minimum starting voltage is output (N in the step S4), the process returns to the step S5.

In this case, the operation sequence is performed with an infinite loop. If the operation sequence goes on, the operation fails to be stopped. Therefore, it is also preferable to provide a function of waiting for a Break signal from the outside in the step S4, and then stopping the electrical power generation if the Break signal is received (Break signal is present in the step S4). It should be noted that in the case of, for example, generating the electrical power semipermanently, the input process of the Break signal can be eliminated.

It should be noted that by changing the step-up operation status, it becomes possible to perform control of, for example, deferring the startup until the status is set to OK on a load, not shown, connected to the power generation unit 100. The power generation unit described above has the following advantages.

As shown in FIGS. 3A through 3D, by using the resonant phenomenon in the resonant circuit provided with the inductor L and the capacitive component C0 of the piezoelectric element 108, there can be obtained the voltage with a larger amplitude than the voltage the piezoelectric element 108 can output by itself as described above. Therefore, since the electrical power can be taken out from the piezoelectric element 108 with a higher efficiency, it is possible to obtain a small-sized and efficient power generation unit.

As described in "Operation in Steady State," the charge in the piezoelectric element 108 increases every time the piezoelectric element 108 is deformed, unless the charge is made to flow out of the piezoelectric element 108. Therefore, the voltage between the terminals of the piezoelectric element 108 increases. Therefore, if the loss caused when the charge flows through the inductor L and the first switch SW1, for example, is not considered, it is possible to gradually increase the voltage between the terminals of the piezoelectric element 108. Therefore, it is possible to generate the electrical power at a voltage automatically raised to the voltage necessary to drive the electrical load without providing an additional step-up circuit.

Once the voltage of the capacitor C drops to a level lower than the lower limit voltage with which the control circuit 110 can drive the first switch SW1, it becomes unachievable to actively control the first switch SW1, and it becomes unachievable to perform the electrical power-generating operation described above. In this occasion, the operation of switching the control circuit 110 from the full bridge rectifier 120 to the voltage doubler rectifier 120a is performed. Therefore, the control circuit 110 is supplied with a voltage approximately twofold of the voltage in the piezoelectric element 108. Since the voltage of the capacitor C exceeds the lower limit voltage, with which the control circuit 110 can drive the first switch SW1, by performing the voltage doubler rectification, the control circuit 110 is switched to the full bridge rectifier 120 and is operated in the rectifying mechanism described above to thereby make it possible to provide a power generation unit is possible to provide a self-recoverable and highly efficient power generation unit.

Since it becomes possible to switch the circuit from the full bridge rectifier 120 to the voltage doubler rectifier 120a only by closing the second switch SW2, it becomes possible to provide a power generation unit provided with a high electrical power generation efficiency while preventing the number of components from increasing and capable of achieving the self-recovery. In addition, since the full bridge rectifier 120 is obtained only by keeping the second switch SW2 open in the case of keeping the voltage equal to or higher than the lower limit voltage, it is possible to perform electrical power generation without degrading the electrical power generation efficiency.

Figure 6:
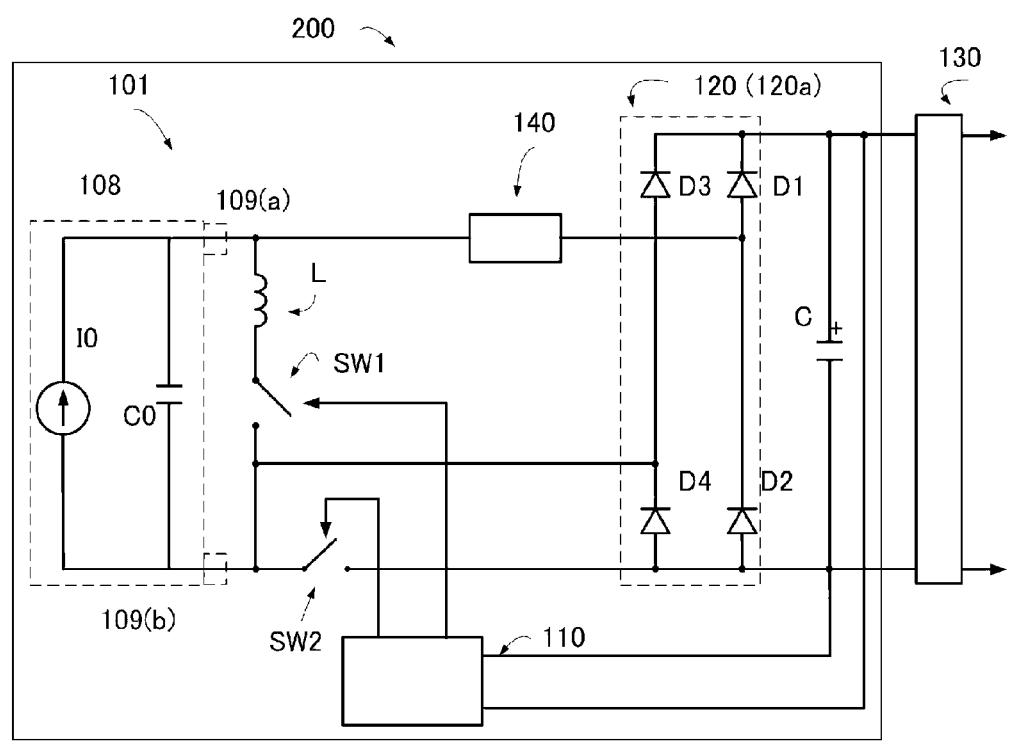
FIG. 6 is a circuit diagram of a secondary cell according to the embodiment.

By using a normally-off switch as the first switch SW1 and a normally-on switch as the second switch SW2, the full bridge rectifier 120 functions as the voltage doubler rectifier 120a if the voltage from the both ends of the capacitor C is stopped. Therefore, it is possible to provide a power generation unit capable of achieving the self-recovery and having a high electrical power generation efficiency.
Secondary Cell Hereinafter, an example of forming a secondary cell will be explained. FIG. 6 is a circuit diagram of the secondary cell according to the present embodiment. The secondary cell 200 is provided with a power generation unit 101, and a voltage regulator 130. Since the power generation unit 101 is described above, duplication of the explanation will be avoided.

The voltage regulator 130 is supplied with the electrical power from the power generation unit 101, and supplies a load not shown with the electrical power. Although the example using the power generation unit 101 is explained here, the power generation unit 100 can also be used instead thereof.

The secondary cell 200 described above has the following advantages. If there occurs the condition in which the inter-terminal voltage of the capacitor C drops to a level lower than the lower limit voltage described above, the voltage doubler rectification is performed as described above once the vibration is applied. Then, when the voltage equal to or higher than the lower limit voltage is reached, the operation is switched to the step-up operation, and it becomes possible to efficiently provide the stabilized voltage to a load not shown under the voltage control by the voltage regulator 130.

Electronic Apparatus

Figure 7:
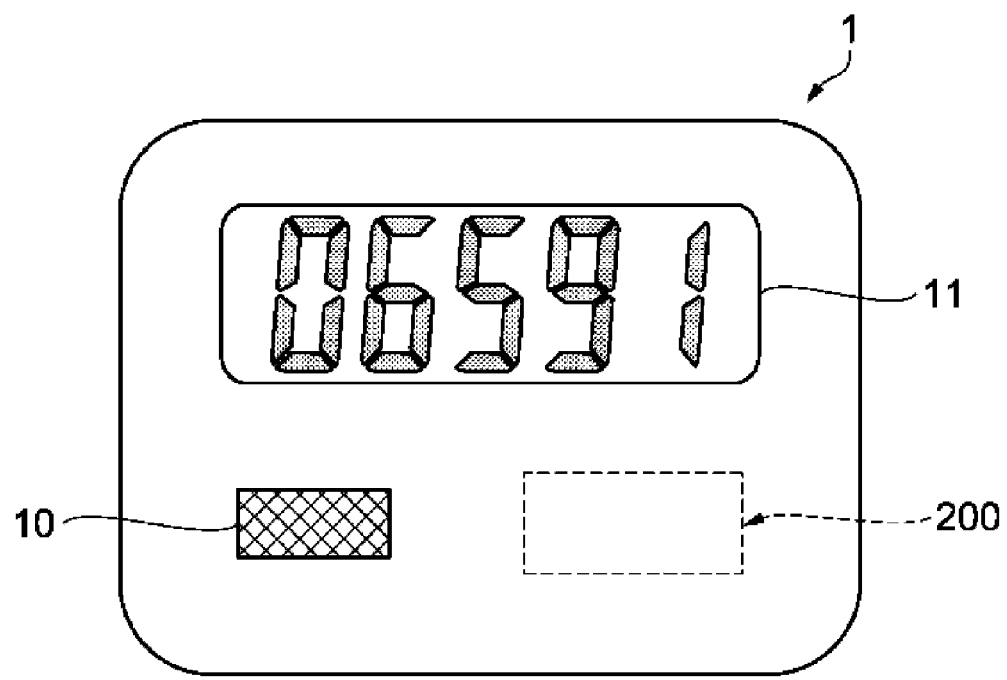
FIG. 7 is schematic diagram showing a schematic structure of a pedometer (a manpo-kei, which is a registered trademark) as an electronic apparatus according to the embodiment.

Hereinafter, an example of an electronic apparatus will be explained. FIG. 7 is schematic diagram showing a schematic structure of a pedometer (a manpo-kei, which is a registered trademark) as the electronic apparatus according to the present embodiment. The pedometer 1 is provided with a reset button 10, a display section 11, and the secondary cell 200. In the case in which the pedometer 1 is at rest for a long period of time, the inter-terminal voltage of the capacitor C (see FIG. 6) provided to the secondary cell 200 is held in the state of being lower than the lower limit voltage described above.

Here, once a vibration is applied to the pedometer 1, the secondary cell 200 performs the voltage doubler rectification as described above, then performs the step-up operation immediately after the voltage equal to or higher than the lower limit voltage has been accumulated, and thus the pedometer 1 operates.

It should be noted that although the pedometer 1 is cited here as an example of the electronic apparatus, the electronic apparatus is not limited thereto, and the invention can also be applied to electronic apparatuses operating in response to a mechanical vibration, such as a wristwatch or a wearable appliance. In particular, since the step-up operation is a rectification method with a high efficiency, the invention can preferably be applied to the electronic apparatus corresponding to applications with high power consumption and required to operate wirelessly.

The electronic apparatus described above has the following advantages. The secondary cell 200 performs the step-up operation with a high electrical power generation efficiency, and can therefore provide the electrical power efficiently even with the vibration having a small amplitude. Therefore, it becomes possible to add a calculation function requiring electrical power such as the calorie calculation to the function of the pedometer 1.

It should be noted that the invention is not limited to the embodiments described above, but various modifications or improvements can be provided to the embodiments described above. Modified examples will be described below. It should be noted that in the explanation of the modified examples, the constituents substantially the same as those in the embodiments described above will be denoted by the same reference symbols, and the explanation therefor will be omitted.

First Modified Example

Figure 8:
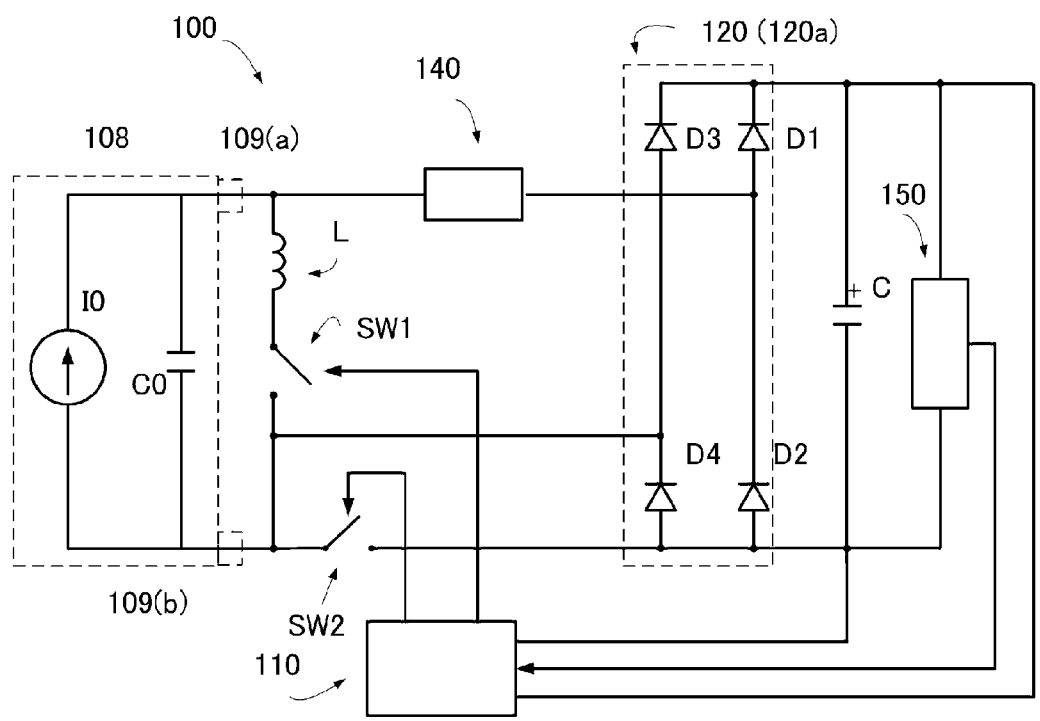
FIG. 8 is a circuit diagram for explaining a first modified example.

FIG. 8 is a circuit diagram for explaining the present modified example. As shown in FIG. 8, a storage voltage detect circuit 150 for detecting the inter-terminal voltage of the capacitor can also be disposed between the both terminals of the capacitor C. The control circuit 110 performs the step-up operation in the case in which the inter-terminal voltage of the capacitor C exceeds the lower limit voltage necessary for the step-up operation, and performs the control of opening the first switch SW1 and shorting the second switch SW2 in the case in which the inter-terminal voltage is lower than the lower limit voltage. Thus, the switching between the step-up operation and the voltage doubler rectification is performed efficiently, and it is possible to provide a power generation unit with a high electrical power generation efficiency.

Second Modified Example

Figure 9A:
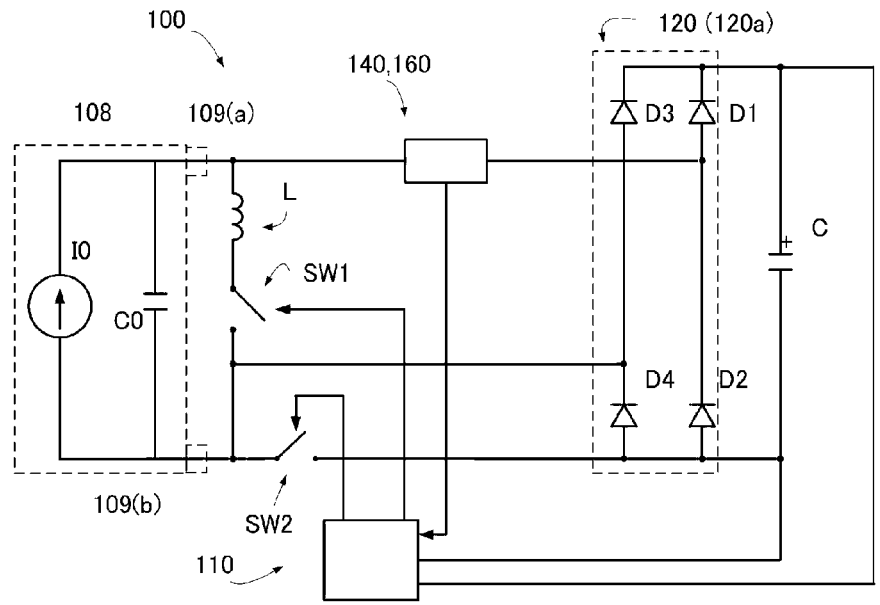
FIGS. 9A and 9B are circuit diagrams for explaining a second modified example.
Figure 9B:
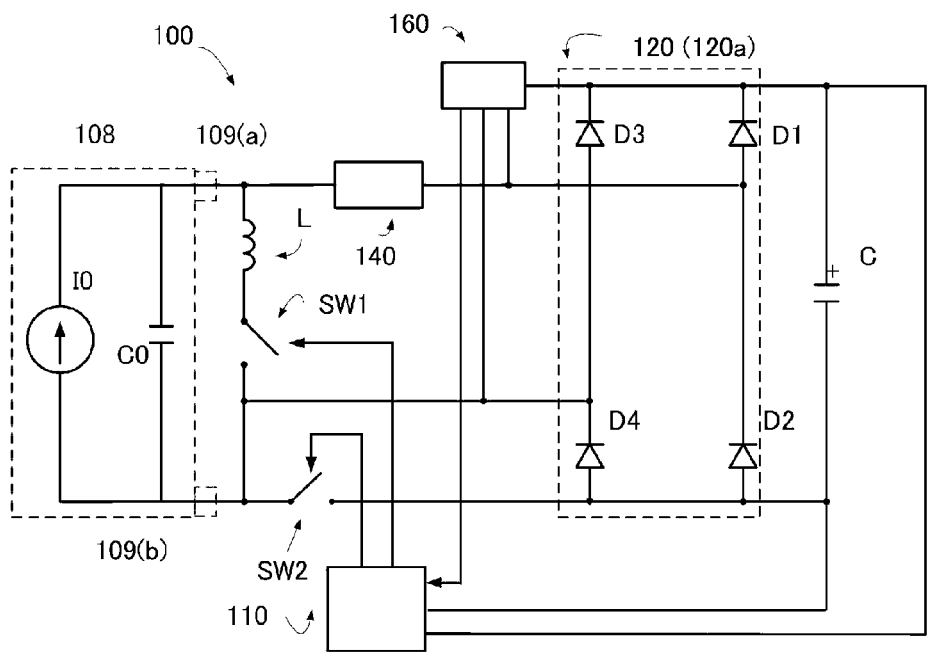

FIGS. 9A and 9B are circuit diagrams for explaining the present modified example. There is provided a charging state detection section 160 for determining whether or not a current is flowing from the piezoelectric element 108 to the full bridge rectifier 120, and if the charging state detection section 160 fails to detect charging during the step-up operation, it is possible for the control circuit 110 to stop the step-up operation, and at the same time, short the second switch SW2. The state in which the charging state detection section 160 fails to detect charging corresponds to the state in which no current is flowing from the piezoelectric element 108 to the capacitor C, and the state in which the step-up operation makes no contribution to the electrical power generation. By stopping the step-up operation on this occasion, it is possible to prevent the electrical power for driving the first switch SW1 from being wasted.

Further, if the step-up operation is stopped, only the full bridge rectifier 120 is usually used. Therefore, the generation voltage of the piezoelectric element 108 is dropped to a level lower than in the case of performing the step-up operation, and it becomes difficult to make the current flow from the piezoelectric element 108 to the capacitor C. However, by shorting the second switch SW2 to thereby switch the circuit to the voltage doubler rectifier 120a, since the output voltage of the piezoelectric element 108 increases to a level higher than in the full bridge rectifier 120, it becomes easy to supply the capacitor C with the current. According to the above configuration, a power generation unit with a high electrical power generation efficiency can be provided.

It should be noted that it is also possible for the charging state detection section 160 to detect the current actually flowing from the piezoelectric element 108 to the full bridge rectifier 120. In this case, as shown in FIG. 9A, the charging state detection section 160 can be substituted with the member 140 shown in FIG. 2A for detecting the timing at which the deformation direction is switched. Besides the above, there can also be cited a method in which the charging state detection section 160 measures the voltages between the anode and the cathode of the diodes D1, D3 of the full bridge rectifier 120 to thereby detect whether or not the charging is in progress as shown in FIG. 9B. In this case, if the voltage on the anode side is higher than that on the cathode side, it is determined that the current is flowing from the piezoelectric element 108 to the electric storage element C, and therefore, the capacitor C is in the charging state. This method does not require measurement of the faint current flowing from the piezoelectric element, and is therefore easy to put into practice.

Third Modified Example

Figure 10:
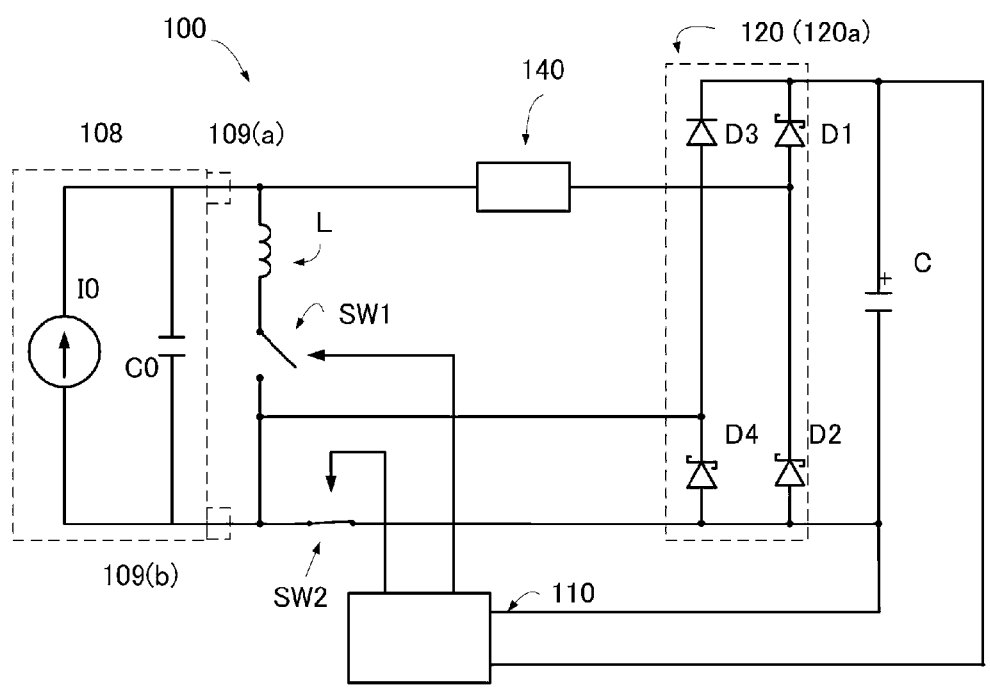
FIG. 10 is a circuit diagram for explaining a third modified example.

The explanation will be presented with reference to FIGS. 4A and 10. FIG. 10 is a circuit diagram for explaining the present modified example. In the third and fourth modified examples, the full bridge rectifier 120 is formed using schottky barrier diodes. The schottky barrier diode has a feature that the forward voltage drop is lower than that of the junction diode. Therefore, the loss corresponding to the forward voltage drop of the full bridge rectifier is reduced, the it becomes possible to supply the capacitor with a higher voltage. On the contrary, there is a disadvantage of a large reverse leakage current. In the case of operating as the voltage doubler rectifier 120a described above, the diodes D3, D4 do not make a contribution to the rectification (it should be noted that the diode D4 is in the state in which the anode and the cathode are shorted, and therefore has no tangible ill effect). The diode D3 making no contribution to the voltage doubler rectification causes the current to leak, and the electrical power generation efficiency to be degraded. On this occasion, by using the junction diode only as the diode D3, it is possible to prevent the leakage and to make the voltage promptly reach the voltage with which the control circuit 110 can operate. FIG. 10 shows a circuit diagram of the case in which the diode D3 is replaced with the junction diode.

Fourth Modified Example

Figure 11:
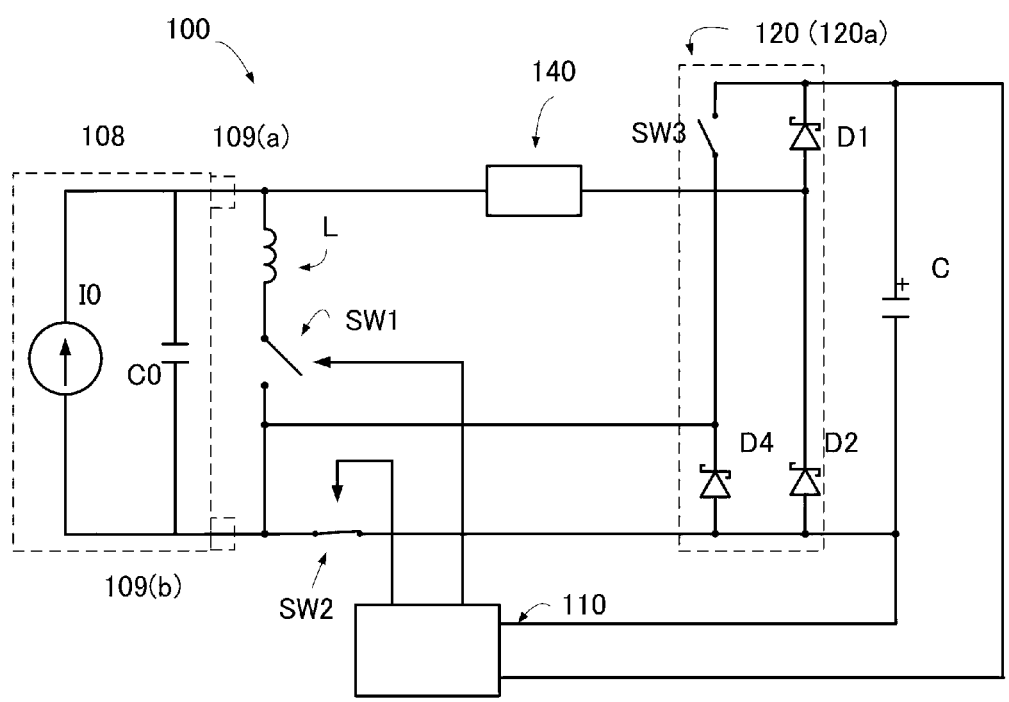
FIG. 11 is a circuit diagram for explaining a fourth modified example.

The explanation will be presented with reference to FIGS. 4A and 11. FIG. 11 is a circuit diagram for explaining the present modified example. In the case of operating as the voltage doubler rectifier 120a described above, the diodes D3, D4 make no contribution to the rectification (It should be noted that the diode D4 is in the state in which the anode and the cathode are shorted, and therefore has no tangible ill effect). In other words, in the case of performing the voltage doubler rectification, the circuit without the diode D3 is superior, ideally. Therefore, by using, for example, a normally-off MOS switch instead of the diode D3, it is possible to prevent the leakage and to make the voltage promptly reach the voltage with which the control circuit 110 can operate. It should be noted that it is possible to make the circuit perform the full-wave rectification while suppressing a loss in the forward direction by controlling the MOS switch so as to perform the synchronous rectification after once the control circuit 110 operates. FIG. 11 shows a circuit diagram of the case in which the diode D3 is replaced with the switch SW3.

This application claims priority to Japanese Patent Application No. 2011-218987, filed on Oct. 3, 2011, the entirety of which is hereby incorporated by reference.

What is claimed is:
1. A power generation unit comprising:
a piezoelectric element including a piezoelectric material;
a deforming member adapted to repeatedly deform the piezoelectric element;
a pair of electrodes provided to the piezoelectric element;
an inductor electrically connected to the piezoelectric element;
a first switch disposed between the piezoelectric element and the inductor;
a member adapted to detect a timing at which a deformation direction of the deforming member is switched;
a full bridge rectifier adapted to rectify a current output from the pair of electrodes;
a capacitor electrically connected to the full bridge rectifier, and adapted to store a current supplied from the full bridge rectifier;
a second switch disposed between either one of the pair of electrodes and the capacitor; and
a control circuit adapted to operate the first switch and the second switch,
wherein after a voltage charged in the capacitor reaches a voltage with which the control circuit can drive the first switch and the second switch, the control circuit sets the second switch to an open state, and performs a control of setting the first switch to a shorted state at the timing at which the deformation direction of the deforming member is switched, and then setting the first switch to the open state after a time corresponding to a half cycle of a resonance period of a resonant circuit composed mainly of the inductor and the capacitor has elapsed.

2. The power generation unit according to claim 1, further comprising:
a charging state detection section adapted to detect a charging state of the capacitor,
wherein when the charging state detection section detects a state in which charging of the capacitor stops, the control circuit performs control of setting the second switch to a shorted state, and setting the first switch to an open state.

3. An electronic apparatus comprising:
the power generation unit according to claim 1.

* * * * *